(12) United States Patent
Bargroff

(10) Patent No.: US 7,369,834 B2
(45) Date of Patent: May 6, 2008

(54) IMPEDANCE-MATCHED IQ NETWORK FOR AN IMAGE REJECTION CIRCUIT

(75) Inventor: Keith P. Bargroff, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 293 days.

(21) Appl. No.: 10/682,652

(22) Filed: Oct. 9, 2003

(65) Prior Publication Data

US 2004/0091053 A1    May 13, 2004

Related U.S. Application Data

(60) Provisional application No. 60/319,612, filed on Oct. 11, 2002.

(51) Int. Cl.
*H04B 1/10*    (2006.01)
(52) U.S. Cl. .................. 455/302; 455/139; 455/138; 455/137; 455/304; 455/296; 333/32
(58) Field of Classification Search ............. 455/139, 455/138, 137, 304, 302, 296; 333/32
See application file for complete search history.

(56) References Cited

U.S. PATENT DOCUMENTS 5,222,246 A * 6/1993 Wolkstein .................. 455/13.4
6,727,771 B2 * 4/2004 Moribe et al. .............. 332/103
6,862,442 B2 * 3/2005 Sanada et al. .............. 455/334
6,980,787 B1 * 12/2005 Dujmenovic ................ 455/318
6,983,129 B2 * 1/2006 Satoh et al. .................. 455/82
6,985,698 B2 * 1/2006 Aggarwal et al. ............ 455/62

OTHER PUBLICATIONS

Gingell, "The Synthesis and Application of Polyphase Filters with Sequence Asymmetric Properties," Ph.D Thesis, 1975, Univ. of London Faculty of Engineering.

* cited by examiner

*Primary Examiner*—Nay Maung
*Assistant Examiner*—Richard Chan
(74) *Attorney, Agent, or Firm*—Clifford B. Perry

(57) ABSTRACT

An impedance-matched IQ network includes a phase shift circuit and a back termination. The phase shift circuit includes an in-phase mixer port for receiving the in-phase signal, a quadrature-phase mixer port for receiving the quadrature phase signal, a termination port, and an output port. The back termination is coupled to the termination port of the phase shift circuit, the back termination having an impedance value substantially equal to the characteristic impedance of the phase shift circuit at the termination port.

24 Claims, 7 Drawing Sheets

IMPEDANCE-MATCHED IQ NETWORK FOR AN IMAGE REJECTION CIRCUIT

CROSS REFERENCE TO RELATED APPLICATIONS

This application claims the benefit of U.S. Provisional Application No. 60/319,612, filed Oct. 11, 2002, the contents of which is herein incorporated by reference in its entirety for all purposes.

BACKGROUND OF THE INVENTION

Image rejection circuits are well known in the art of radio frequency communication systems. These circuits are commonly used to minimize or eliminate the unwanted RF image of the received signal, the reception and processing of which can add noise and distortion to the communication system.

FIG. 1 illustrates a typical image rejection system employed in a communications receiver often referred to as the Harvey architecture. An RF signal 101 is provided to quadrature and in-phase mixers 104 and 106, respectively. An oscillator (not shown) supplies the in-phase mixer with an LO frequency $\cos(\omega_{LO}t)$ and the quadrature phase mixer 106 with the same LO frequency shifted 90 degrees $\sin(\omega_{LO}t)$. The quadrature and in-phase mixers 104 and 106 produces quadrature and in-phase IF signals 107 and 109, respectively. A phase shift of 90 degrees in introduced between the quadrature and in-phase IF signals 107 and 109, typically by means of a phase shifter 108. The phase-shifted quadrature and in-phase signals 111 and 113 are summed together by means of a combiner 112, which produces a combined, image-free IF signal 115.

The phase shifter 108 and the summer 112 are collectively referred to as the "IQ network" or "IQ combiner" within the art, and several different implementations currently exist. FIG. 2A illustrates a first conventional configuration consisting of an RCA (resistor-capacitor) prophase filter. In this arrangement, an RCA network provides a 90 degree phase shift between the I and Q signal paths and sums the quadrature and in-phase signals. The implementation further includes input buffer amplifiers 202 to provide the necessary impedance buffering between the mixers and the input ports of the phase shifter, and output buffer 204 coupled to the output load. The implementation suffers some disadvantageous, however, in that the resistor elements of the phase shifter degrade signal strength and noise figure. Additionally, the non-linearity and noise of the buffer amplifiers 202 and 204 further degrade the network's performance. In addition, variation in buffer gain and in the RCA components introduce gain and phase mismatch.

FIG. 2B illustrates a second conventional IQ network. This arrangement, known as the Weaver architecture, consists of second stage quadrature and in-phase mixers 222 and 224, respectively, which are supplied with a second LO frequency 90 degrees apart $\cos(\omega_{LO}t)$ and $\sin(\omega_{LO}t)$. This architecture suffers drawbacks such as complexity in its fabrication and biasing, degraded noise figure, and higher non-linearity, due to the implementation of additional mixers 222 and 224.

Accordingly, there is a need for an improved IQ network having improved performance and greater simplicity in its implementation.

SUMMARY OF INVENTION

The present invention provides an impedance-matched IQ network which allows the image rejection circuit to operate with lower signal losses, lower noise, and lower distortion for improved performance. Additionally, the circuit elements of the IQ network may, but not necessarily, be configured to function as the biasing circuitry for the connecting mixers.

In one embodiment, the impedance-matched IQ network includes a phase shift circuit and a back termination. The phase shift circuit includes an in-phase mixer port for receiving the in-phase signal, a quadrature-phase mixer port for receiving the quadrature phase signal, a termination port, and an output port, the phase shift circuit configured to provide substantially a ±90 degree phase shift between the in-phase and quadrature-phase mixer ports. The back termination is coupled to the termination port of the phase shift circuit, the back termination having an impedance value substantially equal to the characteristic impedance of the phase shift circuit at the termination port.

This and other embodiments of the invention will be understood in greater detail in view of the following drawings and detailed description.

DETAILED DESCRIPTION

The present invention provides an impedance-matched IQ network for use in an image rejection circuit. As familiar to those skilled in the art of high frequency systems, impedance-matched systems exhibit lower signal loss compared to unmatched systems due to the reduction/elimination of impedance discontinuities. Also, impedance matching is preferred in order to obtain the appropriate performance from the following IF stage; typically an IF filter.

Figure 1:
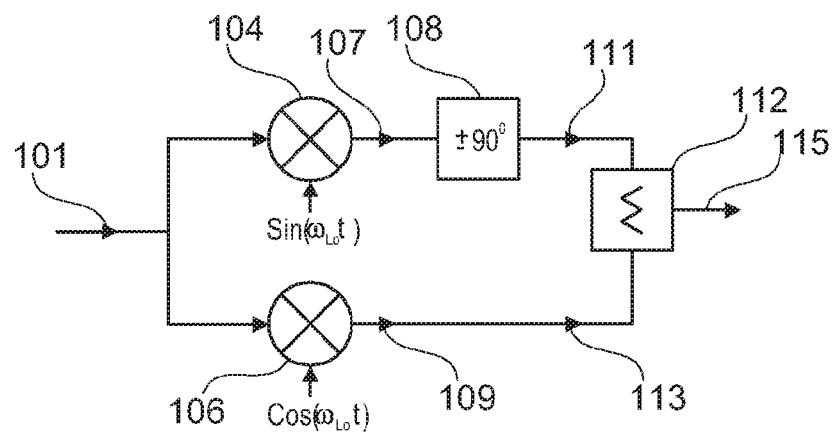
FIG. 1 illustrates a circuit block diagram of a conventional image rejection circuit known in the art.
Figure 2A:
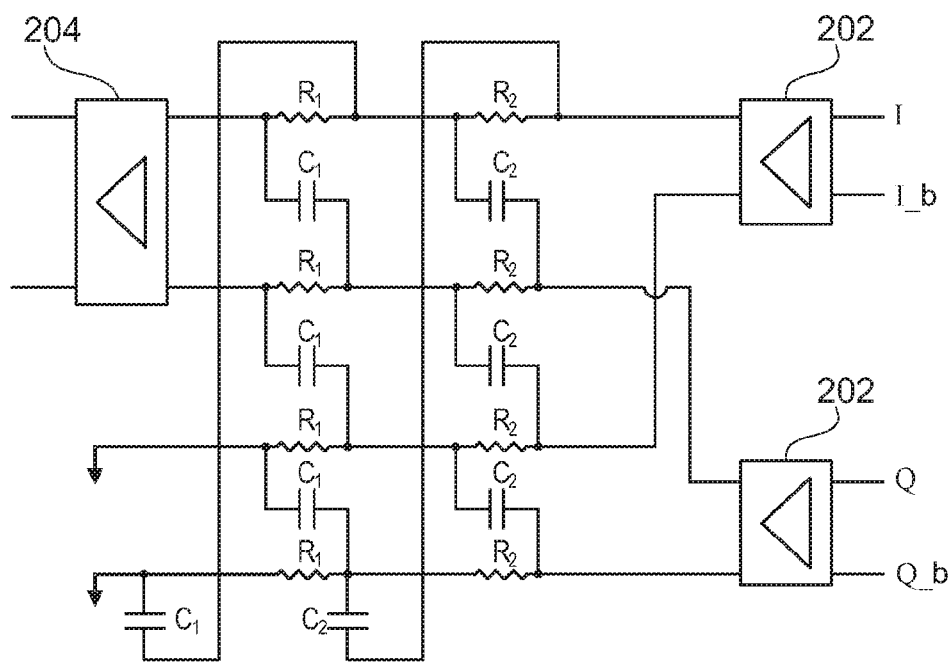
FIG. 2A illustrates a first conventional IQ network known in the art
Figure 2B:
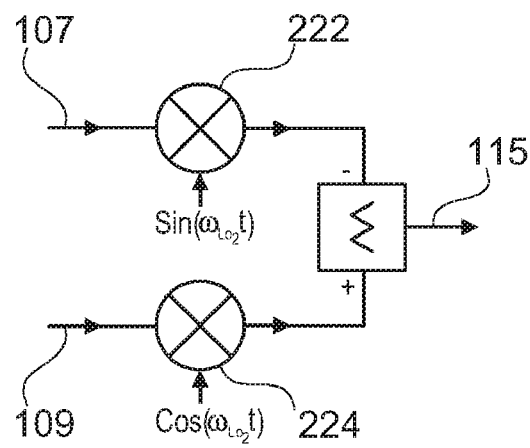
FIG. 2B illustrates a second conventional IQ network known in the art.
Figure 3A:
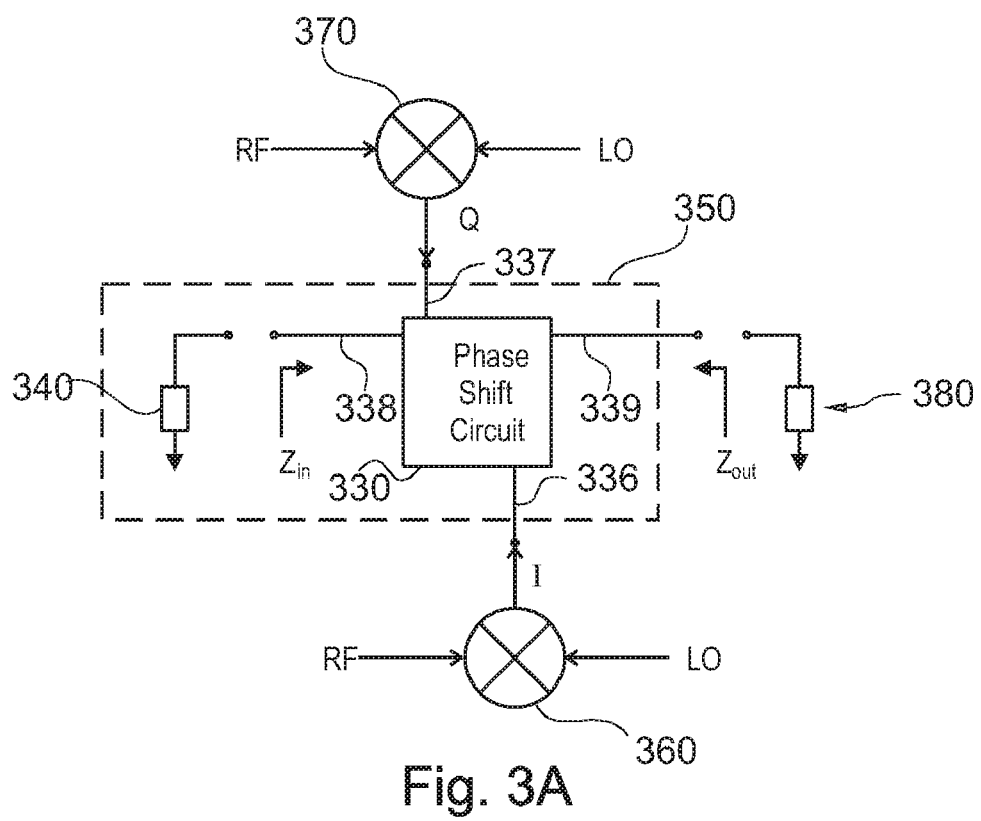
FIG. 3A illustrates a circuit block diagram of an image rejection circuit in accordance with one embodiment of the present invention.

FIG. 3A illustrates a circuit block diagram of an image rejection circuit in accordance with one embodiment of the present invention. The image rejection circuit 300 includes an impedance-matched IQ network 350, in-phase and quadrature phase current mode mixers 360 and 370, and an output load 380 representing the equivalent impedance of the subsequent IF circuitry.

In the preferred embodiment, the impedance-matched IQ network 350 includes a phase shift circuit 330 and a back termination 340. The IQ network 350 operates to (i) phase shift the quadrature phase signal ±90 degrees relative to the in-phase signal, and (ii) sum the phase-shifted quadrature signal with the in-phase signal to produce a combined IQ signal.

The phase shift circuit 330 has (i) an in-phase mixer port 336 coupled to the in-phase mixer, (ii) a quadrature-phase mixer port 337 coupled to the quadrature phase mixer, (iii) a termination port 338 coupled to the back termination 340, and (iv) an output port 339 coupled to the output load 380. Preferably, the phase shift circuit 330 includes one or more phase shifters, further described below, coupled between the in-phase and quadrature-phase mixer ports 336 and 337 so as to provide a 90 degree phase shift therebetween. Further preferably, each phase shifter is designed to exhibit a predefined characteristic impedance (e.g., 50 ohms) at the desired frequency of operation. The design process by which the phase and characteristic impedance conditions are simultaneously met is well known in the art. Such design processes include hand calculations, use of computer aided engineering design tools, or tables which may be consulted to obtain representative circuit parameters. Those skilled in the art will appreciate that the 90 degree phase shifter coupled between the in-phase and quadrature-phase mixer ports may be constructed as a single 90 degree phase shift circuit, two 45 degree circuits, three 30 degree phase shift circuits, etc. Exemplary embodiments of a 90 degree phase shifter is illustrated below.

The back termination 340 is coupled to the termination port 338 of the phase shift circuit 330, and preferably has an impedance value which substantially matches the impedance $Z_{in}$ present at termination port 338 of the phase shift circuit 330. In the preferred embodiment, the back termination 340 includes a resistive element (i.e., a resistive film, lossy component, resistor, etc.) which damps any reflected signals propagating along the phase shift circuit 330.

Figure 3B:
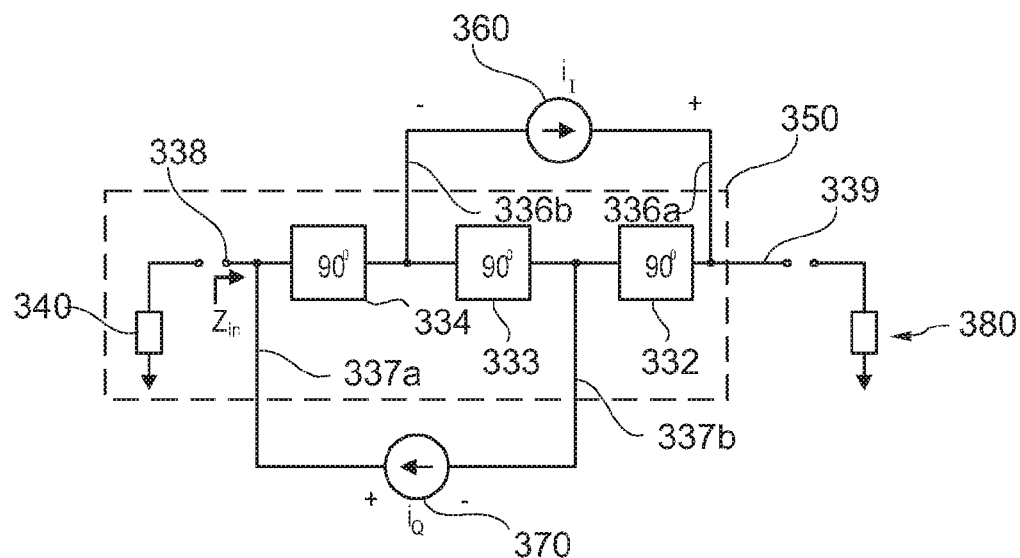
FIG. 3B illustrates a circuit diagram of a first image rejection circuit in accordance with the present invention.

FIG. 3B illustrates a circuit diagram of first image rejection circuit in accordance with the present invention, with previously identified components retaining their reference numerals. In this embodiment, the in-phase and quadrature phase mixers 360 and 370 are configured as current mode elements, and the phase shift circuit 330 is implemented as three, series-coupled 90 degree phase shifters.

The impedance-matched IQ network 350 is configured as three series-coupled 90 degree phase shifters 332, 333, and 334, and a back termination 340. The 90 degree phase shifters 332, 333, and 334, may be realized in various forms such as pi or T-type L-C (inductor-capacitor) structures, distributed L-C networks, or transmission lines, as further described below. The back termination 340 is provided to substantially match the input impedance $Z_{in}$ at the termination port 338 to attenuate signal reflections propagating within the IQ network 350. As illustrated, the termination port 338 may be shared with the in-phase (or alternatively, quadrature-phase) mixer port 337 (or 336).

Positive and negative terminals of the in-phase mixer 360 are coupled to the phase shift circuit 330 via in-phase mixer ports 336a and 336b. Similarly, positive and negative terminals of the quadrature phase mixer 370 are coupled to the phase shift circuit 330 via quadrature-phase mixer ports 337a and 337b. Specifically, the in-phase mixer 360 has positive and negative terminals connected to the output (output load side) of phase shifters 332 and 334, respectively. In an exemplary embodiment, a differential gilbert cell mixer is employed, although those of skill in the art will readily appreciate that other mixer types, such as differential-pair singly-balanced mixers, dual-gate FET mixers, FET ring mixers, diode ring mixers, passive ring mixers, and others may be employed in alternative embodiments within the present invention.

In a specific embodiment, the output load 380 and the back termination 340 have substantially the same impedance, for example 50 ohms. In this instance, the characteristic impedance of each phase shifter 332, 334 and 336 is designed to substantially match that impedance (e.g., 50 ohms) to provide the impedance-matching characteristic of the IQ network. While the exemplary embodiment illustrates three phase shifters, a larger or smaller number may be employed in alternative embodiments. For instance, a single phase shifter circuit may be used in a single-ended mixer embodiment as illustrated in FIG. 3A.

Figure 3C:
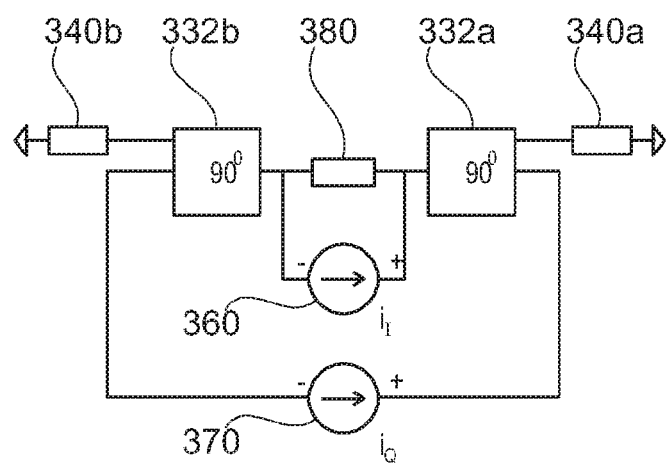
FIG. 3C illustrates a circuit diagram of a second image rejection circuit in accordance with the present invention.

FIG. 3C illustrates a circuit diagram of a second image rejection circuit in accordance with the present invention, with previously identified components retaining their reference numerals. In this embodiment, the output load 380 is a differential load which is coupled to two phase shift circuits comprising single 90 degree phase shifters 332a and 332b, one on each side of the differential load 380. The terminals of the quadrature phase mixer 370 are coupled at the inputs of the phase shift circuits 332a and 332b, and the terminals of the in-phase mixer 360 are coupled at the outputs. Back terminations 340a and 340b are coupled to their respective phase shift circuits 332a and 332b to provide impedance matching to each circuit. As explained above, each of the phase shift circuits 332a and 332b may employ one or more phase shifters to provide the 90 degree phase shift and the desired characteristic impedance.

Those skilled in the art will recognize that the phasing of the IQ network creates a directional property by which the desired IF signal is delivered to the output load 380, while the reflected, unwanted IF signals are dissipated at the back termination 340. A 3 dB improvement in output signal power is provided by the IQ network of the present invention compared to non-directional impedance matched networks.

Figure 4A:
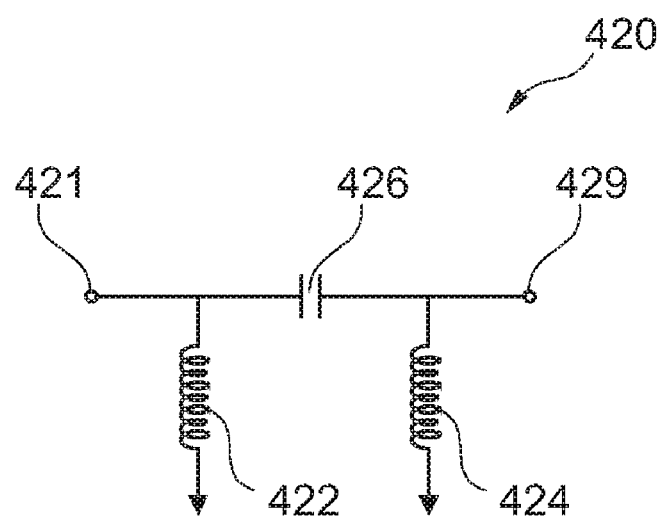
FIGS. 4A-4D illustrates four embodiments of phase shifters which make up the phase shift circuit in accordance with the present invention.

FIGS. 4A-4D illustrates four embodiments of phase shifters which make up the phase shift circuits 332, 334, 336 in accordance with the present invention. FIG. 4A illustrates a pi-type L-C phase shifter 420 having a first shunt inductor 422, a second shunt inductor 424, and a series capacitor 426 connected therebetween. The values of the inductors 422, 424 and capacitor 426 are selected to provide a 90 degree phase shift between ports 421 and 429, and to provide the desired characteristic impedance at the operating frequency. This particular topology provides an additional advantage in that the shunt inductors 422 and 424 can be additionally used to supply bias to the quadrature and in-phase mixers as will be further illustrated below. In an exemplary embodiment in which the phase shifter is designed to exhibit a 90 degree phase shift and a 50 ohm characteristic impedance at 200 MHz, the shunt inductors 422 and 424 have a value of approximately 40 nH, and the series capacitor 426 has a value of approximately 16 pF. In the embodiment in which two or more of these phase shifters are cascaded, the interior shunt inductors are connected in parallel, thereby forming an effective inductance of 20 nH. This exemplary configuration is further illustrated below.

Those of skill in the art will readily appreciate that the dual of this circuit, i.e., a series inductor connected between two shunt capacitors may be alternatively employed as a phase shift circuit as well. Further, a small series and/or large parallel resistor element may be added to the phase shifters to damp possible unwanted signal reflections, in which case the determination of the characteristic impedance includes the presence of this element.

Figure 4B:
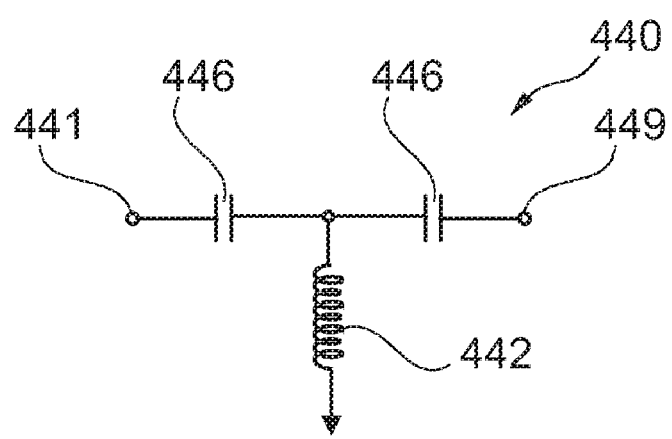

FIG. 4B illustrates a T-type L-C phase shifter 440 having a single shunt inductor 442 coupled between two series capacitors 444 and 446 extending between the input and output ports 441 and 449, respectively. Values of the inductor 442 and capacitors 444 and 446 (and possibly an added resistor) are selected as provided above, and the dual of the circuit may be alternatively employed as well. In embodiments in which two or more of these circuits are cascaded in series, the interior series capacitors may be combined as a single capacitor, the reciprocal value of which is the sum of the reciprocal values of the individual capacitors.

Figure 4C:
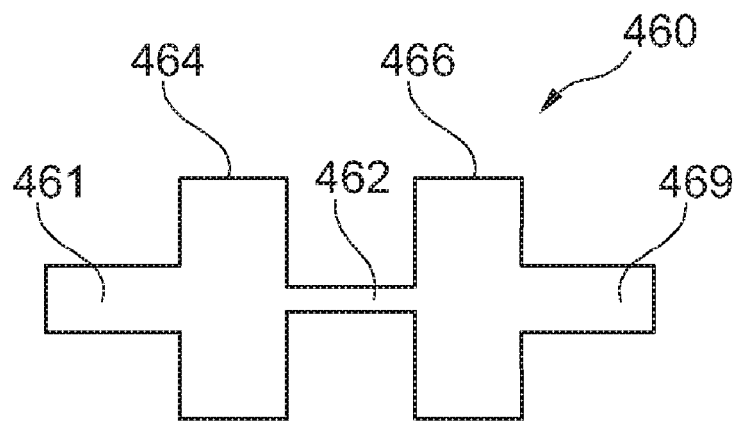

FIG. 4C illustrates a distributed pi-type L-C phase shifter 460 in accordance with the invention. In this embodiment, a series inductor 462 formed as a narrow transmission line section (compared to the input/out line) is connected between two shunt capacitors 464 and 466 formed by two wide transmission line sections. As known in the art, the width and length of these line sections can be manipulated to ascertain the required capacitance and inductance values. The addition of resistive elements, if any, may be accomplished using deposition techniques known in the art. As noted similarly above, the dual of this circuit may also be realized in a distributed form in an alterative embodiment. Further, while the distributed phase shifter 460 is presented in a microstrip architecture, those skilled in the art will appreciate that other distributed topologies such as coplanar waveguide, stripline, coaxial, suspended waveguide, etc. may be used in alternative embodiments within the present invention.

Figure 4D:
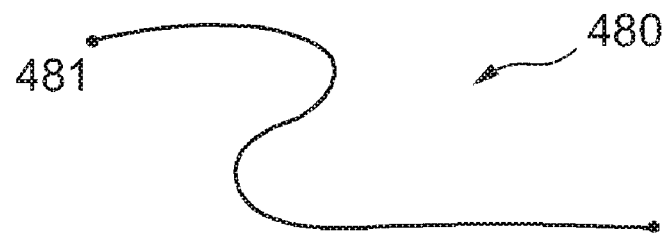

FIG. 4D illustrates a transmission line phase shifter 480 made up of a transmission line having a predefined length and characteristic impedance. The predefined length will provide the desired 90 degree phase difference between the lines ports 481 and 489, and the line's dielectric material and cross-sectional constriction will determine its characteristic impedance. An exemplary, but non-exhaustive list of such lines include printed circuit board lines, coaxial cable, twisted pair, wire, transmission lines constructed in microstrip, coplanar waveguide, stripline, as well as other conventionally-known architectures.

Figure 5:
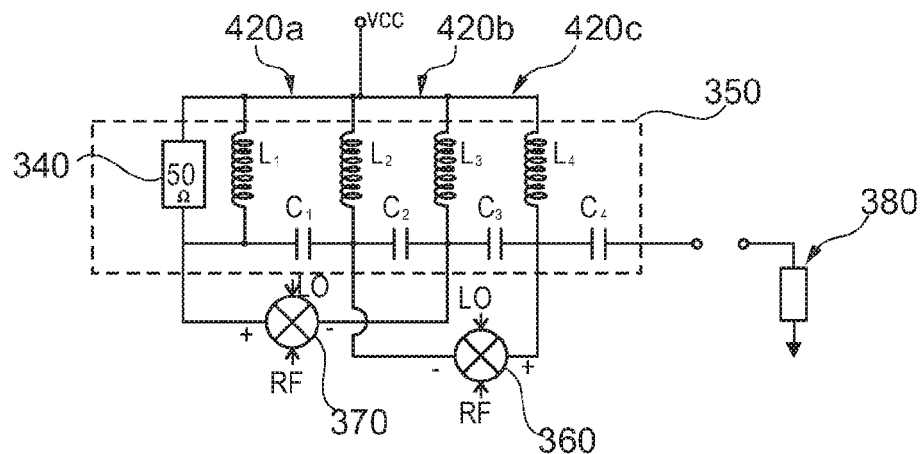
FIG. 5 illustrates a circuit diagram of a 50 ohm impedance-matched image rejection circuit in accordance with one embodiment of the present invention.

FIG. 5 illustrates a circuit diagram of a 50 ohm impedance matched image rejection circuit 500 in accordance with one embodiment of the present invention, with previously identified components retaining their reference numerals. The image rejection circuit 500 includes a 50 ohm, impedance-matched IQ network 350, in-phase and quadrature phase mixers 360 and 370, and a 50 ohm output load 380 representing the equivalent impedance of the subsequent IF circuitry.

In a specific embodiment, the IQ network 350 includes three pi-type phase shifters 420 as previously shown in FIG. 4A, each providing a 90 degree phase shift and exhibiting a 50 ohm characteristic impedance at 200 MHz. In this embodiment, the shunt inductors $L_1$ and $L_4$ are 40 nH, and the series capacitors $C_1$, $C_2$ and $C_3$ are 16 pF. The interior phase shifter 420b includes two shunt inductors of 20 nH, as these inductors are the equivalent of two sets of two, parallel-coupled 40 nH inductors. The IQ network 350 further include a back termination 340 of 50 ohms which matches the characteristic impedance of each phase shifter 420 and the output load 380. Bias current is supplied to the in-phase and quadrature phase mixers 360 and 370 via inductors $L_{1-4}$ within the phase shifters as shown. Capacitor $C_4$ operates as a DC blocking capacitor and can be generally selected to permit passage of the desired IF signal, e.g., 1 nF for the aforementioned exemplary embodiment.

Figure 6A:
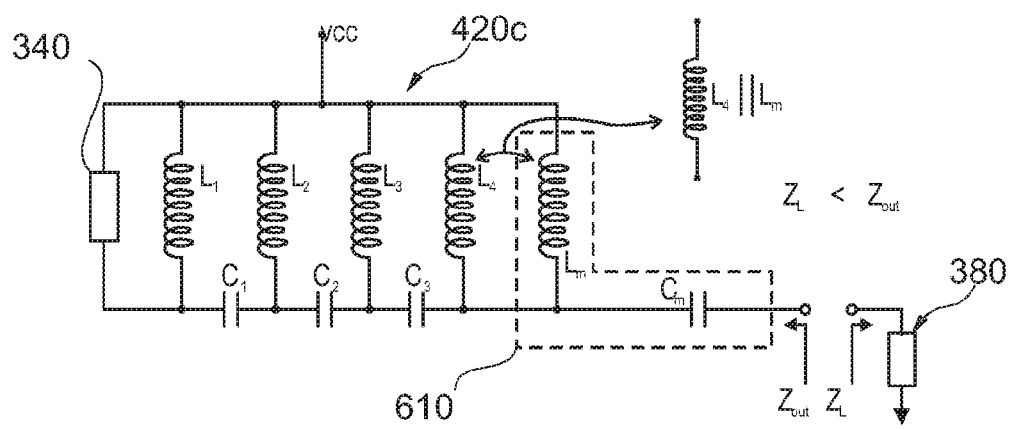
FIG. 6A illustrates the image rejection circuit of FIG. 5 having a first impedance-matching network coupled between the output of the IQ network and the output load.
Figure 6B:
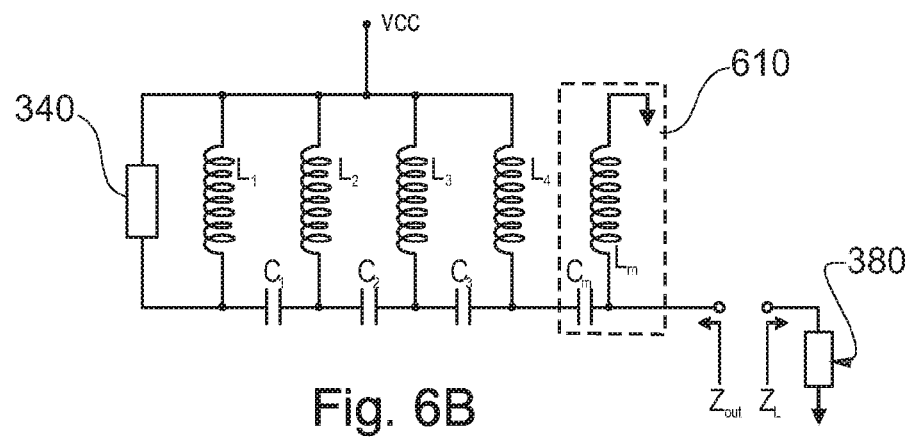
FIG. 6B illustrates the image rejection circuit of FIG. 5 having a second impedance-matching network coupled between the output of the IQ network and the output load.

In some instances, it may be preferable to augment the impedance matching function of the IQ network 350 with a separate impedance matching network. FIGS. 6A and 6B illustrate two exemplary embodiments, although those of skill in the art will appreciate that numerous other matching circuits may be used in alternative embodiments within the invention.

FIG. 6A illustrates the image rejection circuit of FIG. 5 (minus mixers) further having an impedance matching network coupled between the output of the IQ network 350 and the output load 380. In this embodiment, the impedance output load $Z_L$ is determined to be smaller in magnitude than the output impedance of the IQ network $Z_{out}$, and the matching network 610 includes a shunt inductor $L_m$ and a series capacitor $C_m$. The shunt inductor $L_m$ is connected in parallel to the output port inductor of phase shifter 420c, and accordingly the two may be combined into a single inductor, as illustrated. Additionally, the impedance matching capacitor $C_M$ replaces the previously employed DC blocking capacitor $C_4$. The result provides further impedance matching capability without additional components.

FIG. 6B illustrates the image rejection circuit of FIG. 5 having a second embodiment of an impedance-matching network coupled between the output of the IQ network and the output load 380. In this instance, the output load impedance $Z_L$ is determined to be larger than output impedance of the IQ network $Z_{out}$. The matching network 610 includes a series capacitor $C_M$ which replaces the previously employed DC blocking capacitor and which is coupled between the output inductor of the phase shifter 420c and a shunt inductor $L_M$ (coupled to ground). In this embodiment, the additional impedance matching capability can be achieved with the addition of one inductor $L_M$.

Figure 7:
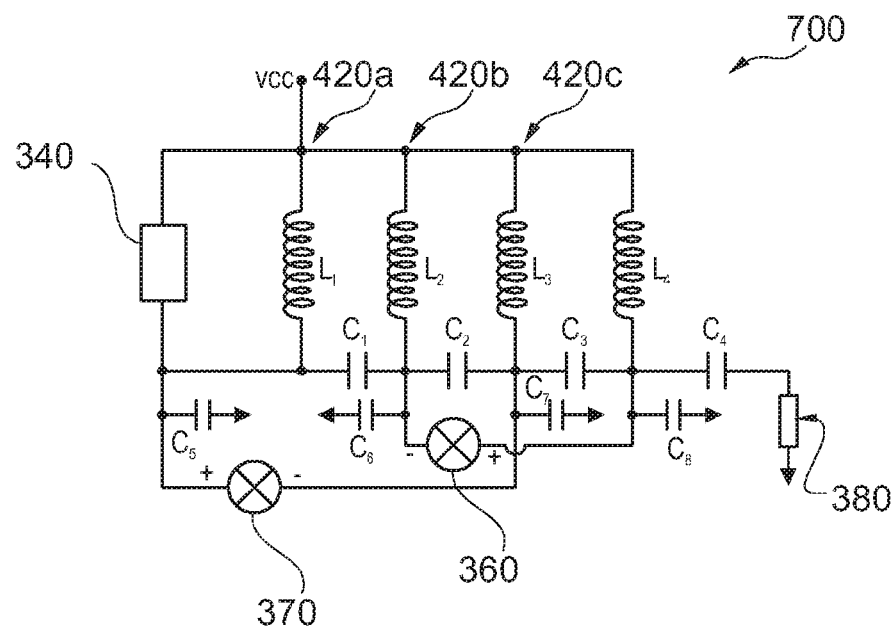
FIG. 7 illustrates the image rejection mixer circuit of FIG. 5 with additional bypass capacitors operable to filter out unwanted high frequency signals.

FIG. 7 illustrates the image rejection mixer circuit of FIG. 5 with additional bypass capacitors operable to filter out unwanted high frequency signals which can be generated during circuit operation. The circuit 700 includes the aforementioned inductor and capacitor elements $L_{1-4}$ and $C_{1-4}$, and bypass capacitors $C_{5-8}$ coupled to the mixer ports as shown. In the preferred embodiment, the values of some/all of the phase shifter's elements are modified with the inclusion of the bypass capacitors $C_{5-8}$ to maintain the 90 degree phase shift and characteristic impedance. In the above exemplary embodiment, the addition of bypass capacitors $C_{5-8}$, each of which is selected to be 4 pF, alters the inductance values of $L_1$ and $L_4$ to 31.8 nH and interior inductors $L_2$ and $L_3$ to 17.7 nH, with capacitors $C_{1-4}$ retaining their previous values. The foregoing example represents just one of the many possible circuit additions or modifications which may be used in alternative embodiments under the present invention.

While the above is a detail description of the present invention, it is only exemplary and various modifications, alterations and equivalents may be employed in various apparati and processes described herein. Accordingly, the scope of the present invention is hereby defined by the metes and bounds of the following claims:

What is claimed is:

1. An impedance-matched IQ network configured to provide substantially a ±90 degree phase shift to a received quadrature phase signal relative to a received an in-phase signal, and to provide a summation of the ±90 degree phase-shifted quadrature phase signal and the received in-phase signal, the impedance matched IQ network comprising:

a phase shift circuit having an in-phase mixer port configured to receive the in-phase signal, a quadrature-phase mixer port configured to receive the quadrature-phase signal, a termination port, and an output port, the phase shift circuit configured to provide substantially a ±90 degree phase shift between the in-phase mixer and quadrature-phase mixer ports; and a back termination coupled to the termination port of the phase shift circuit, the back termination having an impedance value substantially equal to the characteristic impedance of the phase shift circuit at the termination port, wherein said termination port of the phase shift circuit couples to either the in-phase mixer port or the quadrature-phase mixer port of the phase shift circuit, wherein the in-phase or quadrature-phase mixer port to which the termination port is coupled comprises either: (i) a single-ended signal port, or (ii) one of two ports that collectively form a differential signal line.

2. The impedance-matched IQ network of claim 1, wherein the phase shift circuit comprises at least one phase shifter.

3. The impedance-matched IQ network of claim 2, wherein the at least one phase shifter comprises a plurality of series-coupled pi- or T-type phase shifters.

4. The impedance-matched IQ network of claim 2, wherein the at least one phase shifter comprises a plurality of series-coupled distributed pi- or T-type phase shifters.

5. The impedance-matched IQ network of claim 2, wherein the at least one phase shifter comprises a plurality of series-coupled transmission line phase shifters.

6. The impedance-matched IQ network of claim 1, further comprising a matching network coupled to the output port.

7. The impedance-matched IQ network of claim 1, wherein the back termination comprises a resistive element.

8. The impedance-matched IQ network of claim 3, wherein the plurality of phase shifters comprises three series coupled pi-type L-C phase shifters, comprising:

a first pi-type L-C phase shifter comprising a first shunt inductor, a second shunt inductor, and a first series capacitor coupled therebetween;

a second pi-type L-C phase shifter comprising the second shunt inductor, a third shunt inductor, and a second series capacitor coupled therebetween; and a third pi-type L-C phase shifter comprising the third shunt inductor a fourth shunt inductor, and a fourth series capacitor coupled therebetween.

9. The impedance-matched IQ network of claim 3, wherein the plurality of phase shifters comprises three series-coupled T-type L-C phase shifters, comprising:

a first T-type L-C phase shifter comprising a first series capacitor, a second series capacitor, and a first shunt inductor coupled therebetween;

a second T-type L-C phase shifter comprising the second series capacitor, a third series capacitor, and a second shunt inductor coupled therebetween; and a third T-type L-C phase shifter comprising the third series capacitor, a fourth series capacitor, and a third shunt inductor coupled therebetween.

10. An image rejection circuit, comprising:
an in-phase mixer;
a quadrature phase mixer; and an impedance-matched IQ network coupled to the in-phase mixer and to the quadrature phase mixer, the impedance-matched IQ network comprising:

a phase shift circuit having an in-phase mixer port coupled to the in-phase mixer, a quadrature-phase mixer port coupled to the quadrature-phase mixer, a termination port, and an output port, the phase shift circuit configured to provide substantially a ±90 degree phase shift between the in-phase and quadrature-phase ports; and a back termination coupled to the termination port of the phase shift circuit, the back termination having an impedance value substantially equal to the characteristic impedance of the phase shift circuit at the termination port, wherein said termination port of the phase shift circuit couples to either the in-phase mixer port or the quadrature-phase mixer port of the phase shift circuit, wherein the in-phase or quadrature-phase mixer port to which the termination port is coupled comprises either: (i) a single-ended signal port, or (ii) one of two ports that collectively form a differential signal line.

11. The image rejection circuit of claim 10, wherein the phase shift circuit comprises at least one phase shifter.

12. The image rejection circuit of claim 11, wherein the at least one phase shifter comprises a plurality of series-coupled pi- or T-type phase shifters.

13. The image rejection circuit of claim 11, wherein the at least one phase shifter comprises a plurality of series-coupled distributed pi- or T-type phase shifters.

14. The image rejection circuit of claim 11, wherein the at least one phase shifter comprises a plurality of series-coupled transmission line phase shifters.

15. The image rejection circuit of claim 10, further comprising a matching network coupled to the output port.

16. The image rejection circuit of claim 10, wherein the back termination comprises a resistive element.

17. The image rejection circuit of claim 12, wherein the plurality of phase shifters comprises three series coupled pi-type L-C phase shifters, comprising:

a first pi-type L-C phase shifter comprising a first shunt inductor, a second shunt inductor, and a first series capacitor coupled therebetween;

a second pi-type L-C phase shifter comprising the second shunt inductor, a third shunt inductor, and a second series capacitor coupled therebetween; and a third pi-type L-C phase shifter comprising the third shunt inductor a fourth shunt inductor, and a fourth series capacitor coupled therebetween.

18. The image rejection circuit of claim 12, wherein the plurality of phase shifters comprises three series-coupled T-type L-C phase shifters, comprising:

a first T-type L-C phase shifter comprising a first series capacitor, a second series capacitor, and a first shunt inductor coupled therebetween;

a second T-type L-C phase shifter comprising the second series capacitor, a third series capacitor, and a second shunt inductor coupled therebetween; and a third T-type L-C phase shifter comprising the third series capacitor, a fourth series capacitor, and a third shunt inductor coupled therebetween.

19. The image rejection circuit of claim 10, further comprising a first bypass capacitor coupled to the in-phase mixer, and a second bypass capacitor coupled to the quadrature-phase mixer.

20. The image rejection circuit of claim 10, wherein the in-phase and quadrature-phase mixers each comprise differential mixer ports coupled to the impedance-matched IQ network, the impedance-matched network further comprising bypass capacitors coupled to each of the in-phase and quadrature-phase differential mixer ports.

21. An impedance-matched IQ network configured to provide substantially a ±90 degree phase shift to a received quadrature phase signal relative to a received an in-phase signal, and to provide a summation of the ±90 degree phase-shifted quadrature phase signal and the received in-phase signal, the impedance matched IQ network comprising:

phase shifting means having an in-phase mixer port configured to receive the in-phase signal, a quadrature-phase mixer port configured to receive the quadrature phase signal, a termination port, and an output port, the phase shifting means configured to provide substantially a ±90 degree phase shift between the in-phase and quadrature-phase mixer ports; and termination means coupled to the termination port of the phase shifting means, the termination means having an impedance value substantially equal to the characteristic impedance of the phase shifting means at the termination port, wherein said termination port of the phase shift circuit couples to either the in-phase mixer port or the quadrature-phase mixer port of the phase shift circuit, wherein the in-phase or quadrature-phase mixer port to which the termination port is coupled comprises either: (i) a single-ended signal port, or (ii) one of two ports that collectively form a differential signal line.

22. The impedance matched IQ network of claim 1, wherein at least one of the in-phase mixer port or the quadrature-phase mixer port comprises two ports that collectively form a differential signal line; and wherein the back termination is coupled to one of the ports forming the differential signal line of the in-phase mixer port or the quadrature phase mixer port.

23. The impedance matched IQ network of claim 10, wherein at least one of the in-phase mixer port or the quadrature-phase mixer port comprises two ports that collectively form a differential signal line; and wherein the back termination is coupled to one of the ports forming the differential signal line of the in-phase mixer port or the quadrature phase mixer port.

24. The impedance matched IQ network of claim 21, wherein at least one of the in-phase mixer port or the quadrature-phase mixer port comprises two ports that collectively form a differential signal line; and wherein the back termination is coupled to one of the ports forming the differential signal line of the in-phase mixer port or the quadrature phase mixer port.

* * * * *